United States Patent
Cook et al.

(10) Patent No.: US 11,145,598 B2
(45) Date of Patent: Oct. 12, 2021

(54) LATTICE BUMP INTERCONNECT

(71) Applicant: TEXAS INSTRUMENTS INCORPORATED, Dallas, TX (US)

(72) Inventors: Benjamin Stassen Cook, Addison, TX (US); Nazila Dadvand, Richardson, TX (US); Archana Venugopal, Dallas, TX (US); Luigi Colombo, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/236,042

(22) Filed: Dec. 28, 2018

(65) Prior Publication Data

US 2019/0206788 A1  Jul. 4, 2019

Related U.S. Application Data

(60) Provisional application No. 62/611,469, filed on Dec. 28, 2017.

(51) Int. Cl.
  *H01L 23/528* (2006.01)
  *H01L 21/768* (2006.01)
  *H01L 23/532* (2006.01)

(52) U.S. Cl.
  CPC ...... *H01L 23/528* (2013.01); *H01L 21/76823* (2013.01); *H01L 21/76838* (2013.01); *H01L 21/76874* (2013.01); *H01L 23/53228* (2013.01)

(58) Field of Classification Search
  CPC ... H01L 23/528; H01L 23/532; H01L 21/768; H01L 21/76838; H01L 21/76823; H01L 21/76874; H01L 23/53228

USPC ......................................................... 257/750
See application file for complete search history.

(56) References Cited

U.S. PATENT DOCUMENTS

| | | | | |
|---|---|---|---|---|
| 4,390,028 A * | 6/1983 | Okano | ...................... | G01L 1/20 433/68 |
| 4,978,812 A * | 12/1990 | Akeyoshi | ................. | H05K 9/00 174/389 |
| 5,613,188 A * | 3/1997 | Piech | ...................... | H02K 41/03 428/547 |
| 9,786,620 B2 * | 10/2017 | Kramp | .............. | H01L 21/76832 |
| 2001/0050423 A1 * | 12/2001 | Kariyazaki | ........ | H01L 23/49838 257/678 |
| 2003/0019568 A1 * | 1/2003 | Liu | ........................ | H05K 3/4614 156/245 |
| 2008/0107994 A1 * | 5/2008 | Hannah | .................... | G03F 7/091 430/270.1 |
| 2008/0202585 A1 * | 8/2008 | Yamanaka | ............ | H01G 9/2031 136/263 |
| 2008/0226870 A1 * | 9/2008 | Sypeck | ...................... | B32B 5/26 428/137 |
| 2009/0028979 A1 * | 1/2009 | Asaoka | ................... | B29C 48/30 425/382 R |
| 2010/0226608 A1 * | 9/2010 | Chen | ...................... | B82Y 20/00 385/28 |
| 2012/0326250 A1 * | 12/2012 | Gaidis | ................. | H01F 10/3254 257/421 |

(Continued)

Primary Examiner — Alexander O Williams
(74) Attorney, Agent, or Firm — Dawn Jos; Charles A. Brill; Frank D. Cimino

(57) ABSTRACT

An interconnect structure for a semiconductor device includes a plurality of unit cells. Each unit cell is formed of interconnected conducting segments. The plurality of unit cells forms a conducting lattice.

18 Claims, 5 Drawing Sheets

(56) References Cited

U.S. PATENT DOCUMENTS

| | | | |
|---|---|---|---|
| 2013/0223124 A1* | 8/2013 | Park | G11C 11/16 |
| | | | 365/96 |
| 2016/0172288 A1* | 6/2016 | Audet | H01L 23/49827 |
| | | | 361/783 |
| 2017/0033067 A1* | 2/2017 | Kramp | H01L 21/76832 |
| 2017/0263821 A1* | 9/2017 | In | H01L 33/44 |

* cited by examiner

LATTICE BUMP INTERCONNECT

CROSS-REFERENCE TO RELATED APPLICATION(S)

This application claims priority to U.S. Provisional Application No. 62/611,469, filed Dec. 28, 2017, which is hereby incorporated by reference.

This application is related to commonly owned U.S. Application Ser. No. 62/611,441, filed Dec. 28, 2017, entitled "DISSIMILAR MATERIAL INTERFACE HAVING LATTICES".

BACKGROUND

Bumps are micro-electrical contacts that play a critical role of establishing electrical connections between semiconductor die connections and a lead frame. The electromigration failure mode of bumps resulting from interdiffusion of copper (Cu) (or other conducting material) and tin (Sn) is a significant problem in semiconductor devices. Thus, in order to solve this problem, it is desirable to provide a semiconductor device that is able to overcome the above disadvantage. Advantages of the present invention will become more fully apparent from the detailed description of the invention hereinbelow.

SUMMARY

In one aspect of the disclosure, an interconnect structure for a semiconductor device includes a plurality of unit cells. Each unit cell is formed of interconnected conducting segments. The plurality of unit cells forms a conducting lattice.

In another aspect of the disclosure, a structure for a semiconductor device includes a semiconductor wafer comprising conducting pillars. The structure also includes an interconnect structure including a plurality of unit cells. Each unit cell is formed of interconnected conducting segments. The plurality of unit cells forms a conducting lattice, and the conducting lattice is connected to the conducting pillars.

In yet another aspect of the disclosure, a method of forming an interconnect structure for a semiconductor device includes photo-initiating polymerization of a monomer in a pattern of unit cells to form a polymer lattice and unpolymerized monomer. The method also includes removing the unpolymerized monomer. The method further includes coating the polymer lattice with conducting material. The method yet further includes removing the polymer lattice to leave a conducting lattice.

BRIEF DESCRIPTION OF THE DRAWINGS

For a detailed description of various examples, reference will now be made to the accompanying drawings in which.

DETAILED DESCRIPTION

Figure 1:
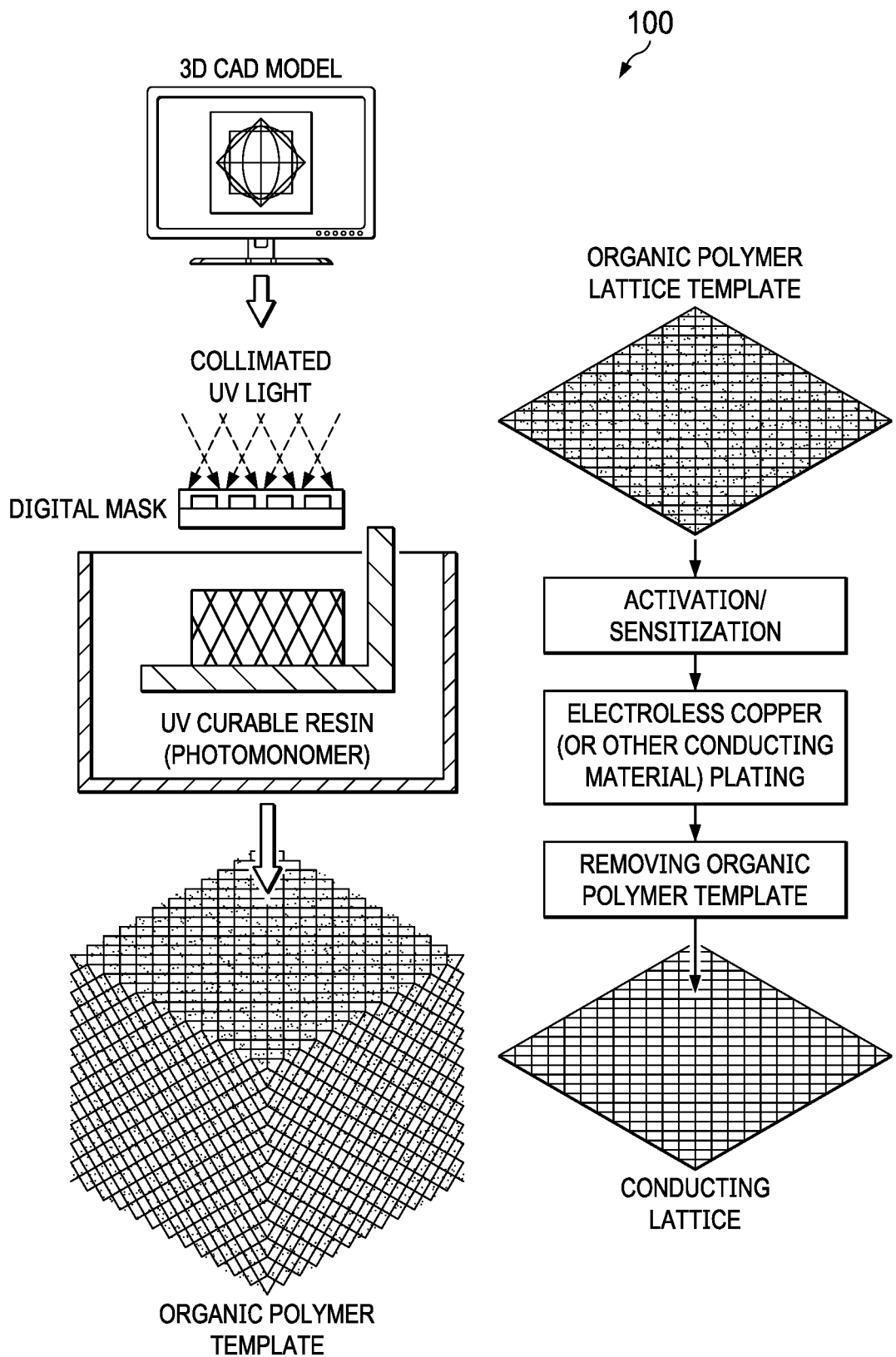
FIG. 1 is a schematic drawing of a fabrication process for a conducting lattice bump interconnect, in accordance with this disclosure.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The increasing demand for miniaturization of semiconductors necessitates the increased current density per bump. Therefore, the electromigration failure mode of bumps is critical to determine the bump current carrying capability. Electromigration failure in Cu pillar bumps and also in solder bumps is attributed to the depletion of intermetallic compounds at the interface of Cu and Sn.

For purposes of this disclosure, the term "lattice" may alternatively encompass "microlattice", "nanolattice", and "superlattice" (and derivatives thereof) and thus, may be used interchangeably.

The capability of a bump in carrying current is influenced by electromigration. The electromigration resistance is improved by the presence of the intermetallic compounds at the Cu interface of Cu—Sn.

At the interface of Cu and Sn, intermetallic compounds form that are mainly composed of $Cu_6Sn_5$ or η-phase and a limited amount of $Cu_3Sn$ (ε-phase) as a non-continuous layer at the copper surface after the reflow, resulting in voiding and microcracks. Voiding and micro-cracks elimination and/or reduction at a location in a semiconductor device where a Cu—Sn interface is typically located is desired to be achieved. The Cu—Sn intermetallic layer is dominated by formation of $Cu_6Sn_5$ (η) phase and a limited amount of $Cu_3Sn$ (ε) is formed as a non-continuous layer at the Cu surface. In general, the η-phase shows extensive scalloping with a pattern similar to the ε-islands (ε phase). The Kirkendall voids are usually present in the $Cu_3Sn$-phase mainly in the adjacent of the Cu—$Cu_3Sn$ interface and on the interface itself and the $Cu_3Sn$ layer grows at the expense of $Cu_6Sn_5$ as long as there is a sufficient source of Cu. Therefore, insertion of an intermediate diffusion barrier layer at the Cu—Sn interface can decrease and/or eliminate the inter-diffusion of Cu and Sn. When Ni alone is used as a diffusion barrier layer, formation of brittle intermetallic compounds of $Ni_3Sn_4$ at the Sn and Ni interface occurs which imposes reliability issues. The presence of dissolved Cu into the $Ni_3Sn_4$ slows down the intermetallic growth.

However, the amount of the Cu needs to be small enough to form the $(Cu,Ni)_3Sn_4$ phase. Presence of too much Cu results in formation of a Cu/Ni-intermetallic with the $Cu_6Sn_5$-stoichiometry resulting in extensive scalloping.

Aspects of the disclosure solve the problems associated with the use of Cu—Sn in a semiconductor device by replacing the Sn with a Cu lattice bump interconnect. By using a Cu lattice bump interconnect, there are no longer issues related to electromigration due to the absence of Sn within the interconnect structure and, thus, at any interconnect interface. Another advantage is that the cellular nature of the Cu lattice bump interconnect results in a light-weight device.

The Cu lattice bump interconnect may be formed via any of the fabrication techniques (or portion(s) of the fabrication techniques thereof, including pre-treatment of the polymer lattice prior to formation (e.g., electroless plating) of the metal (e.g., Cu) on the polymer lattice) described in U.S. Provisional Application Ser. No. 62/611,347, filed Dec. 28, 2017, entitled "SP$^2$-Bonded Carbon Structures", all of which are hereby incorporated in this disclosure. Generally, the Cu Lattice bump interconnect may be manufactured by starting with a template formed by self-propagating photopolymer waveguide prototyping, coating the template by electroless Cu plating, and subsequently etching away the photopolymer template. The resulting Cu lattice exhibits complete recovery after compression meeting or exceeding energy absorption characteristics similar to elastomers.

FIG. 1 schematically illustrates a fabrication process 100 including examples of organic polymeric lattice (scaffold) template prior to coating via electroless Cu plating. Projection of collimated UV light through a photomask (e.g., digital mask) or multi-photon photography may be employed in a photo-initiated polymerization to produce a polymer lattice comprised of a plurality of unit cells. Examples of polymers that may be employed include polystyrene and poly(methyl methacrylate) (PMMA). Once polymerized in the desired repeating pattern, the remaining un-polymerized monomer may be removed. After pre-treatment (cleaning, activation, and/or sensitization) of the polymer lattice, the polymer lattice (which serves as a polymer scaffold) may then be plated with Cu via electroless Cu plating. Removal of the polymer lattice may then be performed (via, for example, a process such as dissolution in an organic solvent) thereby leaving the Cu lattice which is used as an interconnect for semiconductor devices in this disclosure. Another discussion of a Cu lattice bump interconnect fabrication process is provided below with respect to FIG. 6.

The overall external dimensions of the formed Cu lattice in any of the examples in this disclosure may be, for example, 5-400 micron in height, 5-400 micron in width, and 5-400 micron in depth. The shape of the Cu lattice may be rectangular, hexagonal, diamond, face centered cubic lattice (FCC), body centered cubic lattice (BCC), or another shape.

Figure 2A:
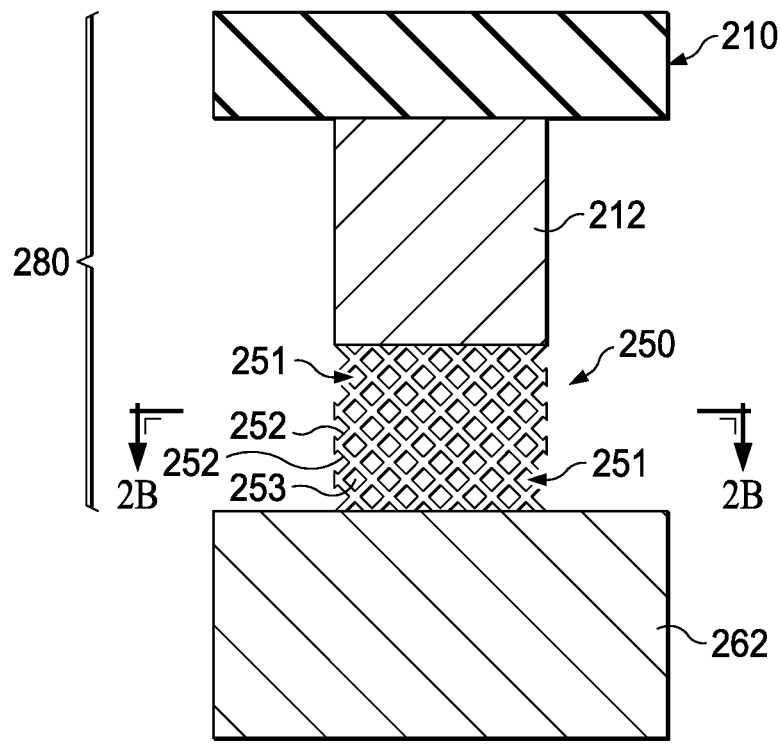
FIG. 2A is a side view of a structure for a semiconductor device, in accordance with this disclosure.
Figure 2B:
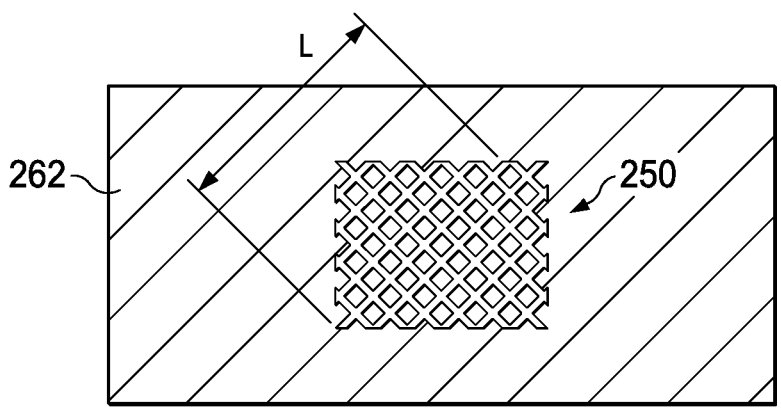
FIG. 2B is a top view taken along line 2B-2B in FIG. 2A.

With reference to FIG. 2A, in one aspect of the disclosure, an interconnect structure 250 for a semiconductor device (or semiconductor wafer) 210 includes a plurality of unit cells 251. Each unit cell 251 is formed of interconnected conducting segments 252. The plurality of unit cells 251 forms a conducting lattice. FIG. 2B is a top view taken along line 2B-2B in FIG. 2A.

In an example, each of the interconnected conducting segments 252 has a length of about 5 microns to about 400 microns extending from one side of the lattice to another side of the lattice.

In an example, the interconnected conducting segments 252 form a flexible structure due to the higher ductility of Cu, as compared to less ductile solder.

In an example, the interconnected conducting segments 252 form a compressible structure also due to the higher ductility of Cu, as compared to less ductile solder.

In an example, each of the interconnected conducting segments 252 is a conducting tube. Each conducting tube is hollow and has a diameter of about 5 nm to about 100 nm. The holes 253 within the lattice each have a diameter of about 5 nm to about 100 nm.

Also, with reference to FIG. 2A, in another aspect of the disclosure, a structure 280 for a semiconductor device includes a semiconductor wafer 210 comprising conducting pillars 212. The structure 280 also includes an interconnect structure 250 including a plurality of unit cells 251. Each unit cell 251 is formed of interconnected conducting segments 252. The plurality of unit cells 251 forms a conducting lattice, and the conducting lattice is connected to the conducting pillars 212.

In an example, each of the interconnected conducting segments 252 has a length (L) (see FIG. 2B) of about 5 microns to about 400 microns extending from one side of the lattice to another side of the lattice.

In an example, the interconnected conducting segments 252 form a flexible structure due to the higher ductility of Cu, as compared to less ductile solder.

In an example, the interconnected conducting segments 252 form a compressible structure also due to the higher ductility of Cu, as compared to less ductile solder.

In an example, each of the interconnected conducting segments 252 is a conducting tube. Each conducting tube is hollow and has a diameter of about 5 nm to about 100 nm. The interconnect structure 250 connects conducting pillars 212 to lead frame 262.

Figure 3:
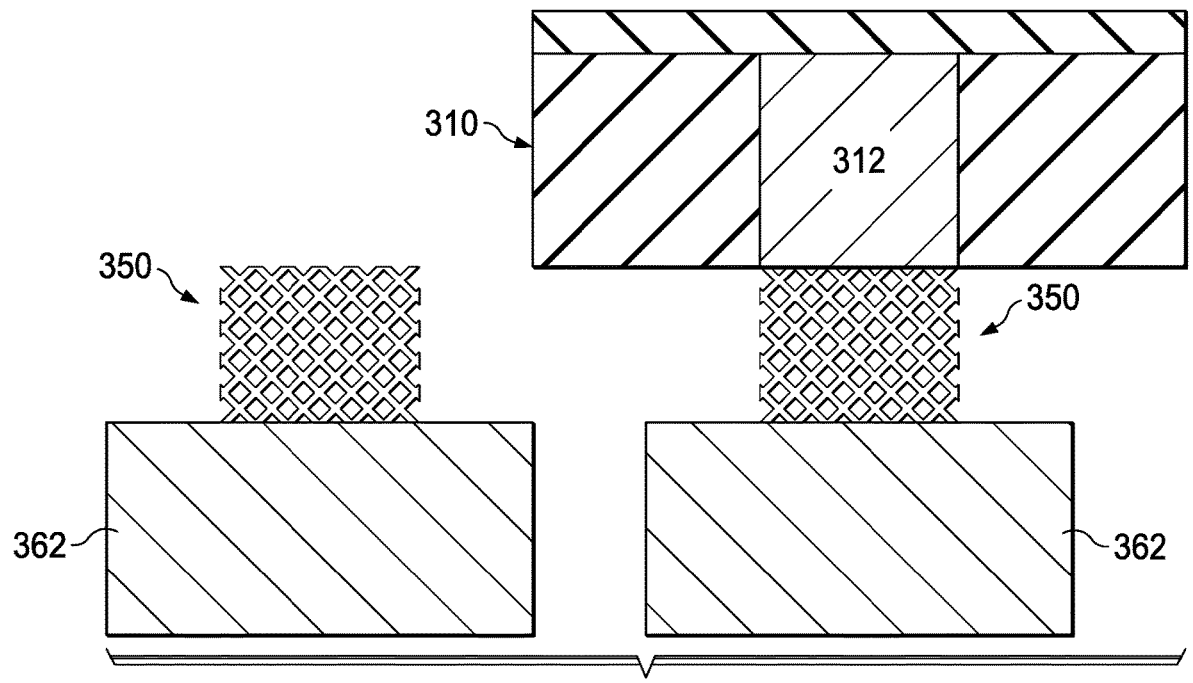
FIG. 3 is a schematic drawing of a fabrication process involving a conducting lattice bump interconnect, in accordance with this disclosure.

FIG. 3 is a schematic drawing of a fabrication process involving an interconnect structure 350 (i.e., a conducting lattice bump interconnect) disposed on a lead frame 362. A conducting pillar 312 of another semiconductor die 310 is then placed on (or is attached to) the interconnect structure 350.

Figure 4:
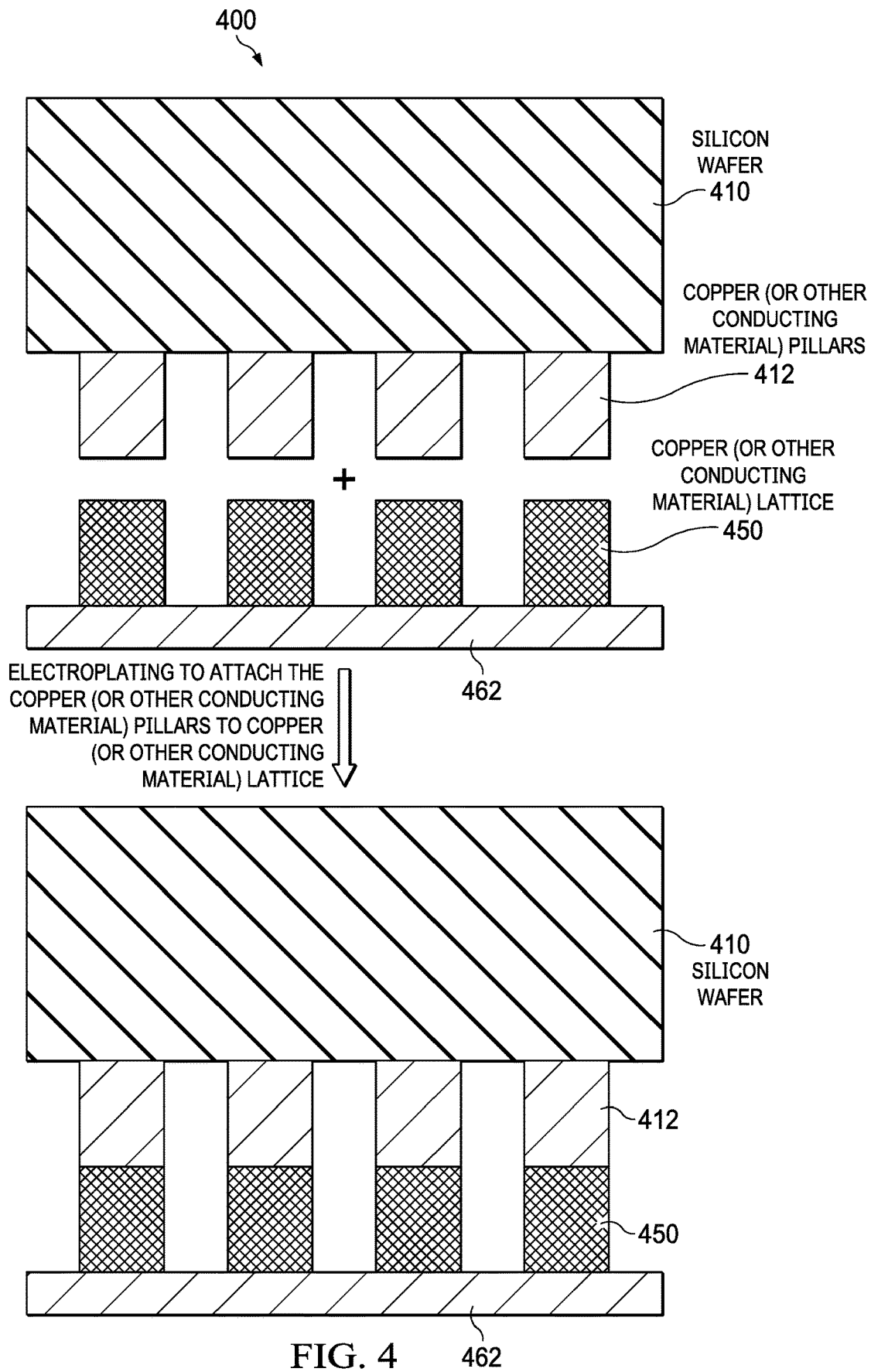
FIG. 4 is a schematic drawing of a fabrication process involving conducting lattice bump interconnects attached to conducting pillars/bumps of a semiconductor wafer device, in accordance with this disclosure.

FIG. 4 is a schematic drawing of a fabrication process 400 involving conducting lattice bump interconnects 450 connected to a lead frame 462. Electroplating is performed to attach the conducting lattice bump interconnects 450 to conducting pillars 412 of a semiconductor wafer device 410.

Figure 5:
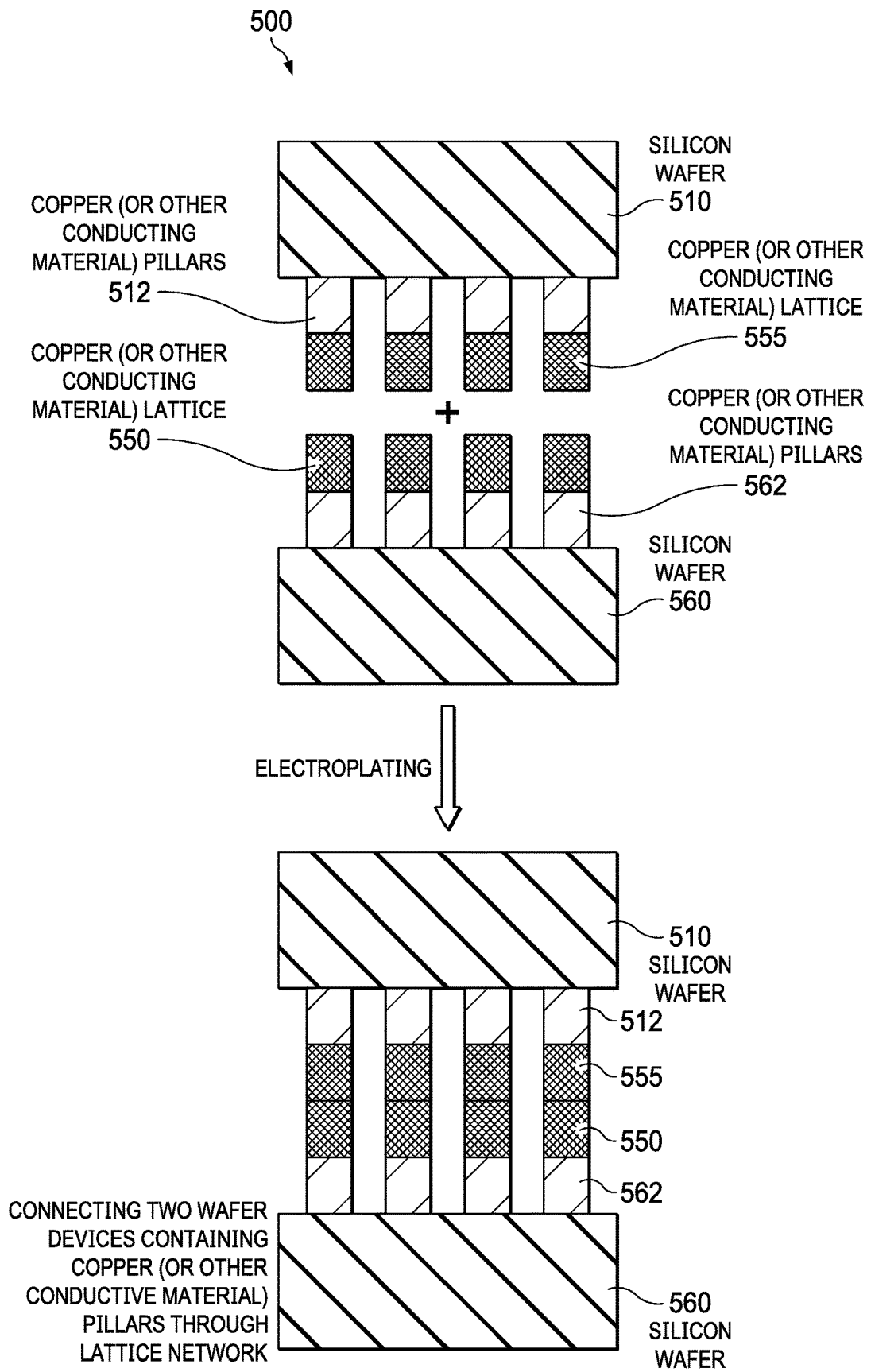
FIG. 5 is a schematic drawing of a fabrication process involving two sets of conducting lattice bump interconnects for connecting conducting pillars/bumps of two semiconductor wafer devices, in accordance with this disclosure.

FIG. 5 is a schematic drawing of a fabrication process 500 involving two sets of conducting lattice bump interconnects 550, 555 for connecting conducting pillars 512, 562 of two semiconductor wafer devices 510, 560. Electroplating is performed to attach the conducting lattice bump interconnects 550 (attached to conducting pillars 562 associated with semiconductor wafer device 560) to conducting lattice bump interconnects 555 (attached to conducting pillars 512 associated with semiconductor wafer device 510). The connected conducting lattice bump interconnects 550, 555 may be referred to as, for example, a lattice network.

Figure 6:
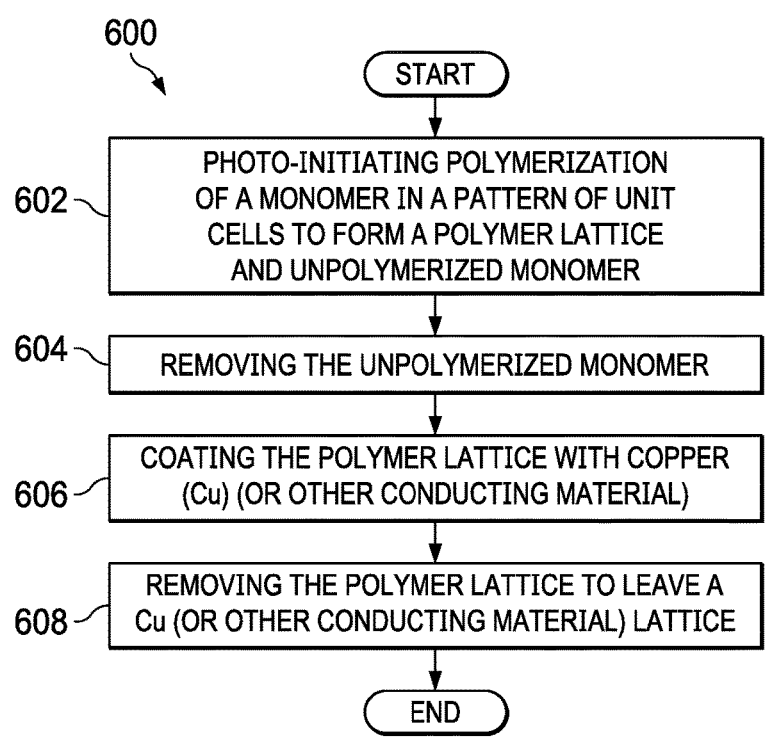
FIG. 6 is a flowchart illustrating an exemplary method for forming an interconnect structure for a semiconductor device, in accordance with this disclosure.

With reference to FIG. 6, in yet another aspect of the disclosure, a method 600 of forming an interconnect structure for a semiconductor device includes photo-initiating polymerization of a monomer in a pattern of unit cells to form a polymer lattice and unpolymerized monomer (block 602). The method also includes removing the unpolymerized monomer (block 604). The method further includes coating the polymer lattice with Cu (or other conducting material) (block 606). The method yet further includes removing the polymer lattice to leave a Cu (or other conducting material) lattice (block 608).

In an example of the method, the photo-initiating of the polymerization of the monomer comprises passing collimated light through a photomask.

In an example of the method, the photo-initiating of the polymerization of the monomer comprises multi-photon photography.

In an example of the method, the coating of the polymer lattice with conducting material comprises electroless deposition of conducting material.

In an example of the method, the polymer lattice comprises polystyrene.

In an example of the method, the polymer lattice comprises poly(methyl methacrylate).

In any of the examples above, the completed conducting lattice could be positioned, for example: between the pillar and a lead frame; grown on a pillar or lead frame, and plated to the other member; grown separately and soldered to both the pillar and the lead frame (both members); and/or grown separately and plated to both members.

In any of the examples above, the conducting lattice may be electrically connected to at least one conducting member on a first device (e.g., lead frame/package substrate/die) and at least one conducting member on a second device (e.g., lead frame/package substrate/die). In an example, the conducting lattice is formed initially and then bonded (or soldered, etc.) onto a lead frame. Such alternatives are considered to be within the spirit and scope of the disclosure, and may therefore utilize the advantages of the configurations and examples described above.

In any of the examples above, the conducting lattice does not have to be between only two members, but could be in a Y, Cactus, or other shape connecting one member to many members on the other side. Such alternatives are considered to be within the spirit and scope of this disclosure, and may therefore utilize the advantages of the configurations and examples described above.

In any of the examples above, the Cu employed in either, some, or all of the lattice, pillars, or other lattice connections (and corresponding processes of manufacturing these or other Cu elements) could alternatively be replaced with another conducting material such as tungsten (W) or aluminum (Al) as examples. Also, the conducting material employed in either, some, or all of the lattice, pillars, or other lattice connections (and corresponding processes of manufacturing these or other conducting elements) could comprise a conducting material such as copper (Cu), tungsten (W) or aluminum (Al). Such alternatives are considered to be within the spirit and scope of the disclosure, and may therefore utilize the advantages of the configurations and examples described above.

The method steps in any of the examples described herein are not restricted to being performed in any particular order. Also, structures mentioned in any of the method examples may utilize structures mentioned in any of the device examples. Such structures may be described in detail with respect to the device examples only but are applicable to any of the method examples.

Features in any of the examples described in this disclosure may be employed in combination with features in other examples described herein, such combinations are considered to be within the spirit and scope of the present disclosure.

The above discussion is meant to be illustrative of the principles and various example implementations according to this disclosure. Numerous variations and modifications will become apparent once the above disclosure is fully appreciated. It is intended that the following claims be interpreted to embrace all such variations and modifications.

What is claimed is:

1. An interconnect structure for a semiconductor device, the interconnect structure comprising:
   a plurality of unit cells, wherein:
      each unit cell is formed of interconnected conducting segments;
      the plurality of unit cells forms a conducting lattice;
      an end of the conducting lattice contacts a portion of a lead frame; and
      the plurality of unit cells does not include solder.

2. The interconnect structure of claim 1, wherein each of the interconnected conducting segments has a length of about 5 microns to about 400 microns extending from one side of the lattice to another side of the lattice.

3. The interconnect structure of claim 1, wherein the interconnected conducting segments form a flexible structure.

4. The interconnect structure of claim 1, wherein the interconnected conducting segments form a compressible structure.

5. The interconnect structure of claim 1, wherein each of the interconnected conducting segments is a conducting tube.

6. The interconnect structure of claim 5, wherein each conducting tube is hollow.

7. The interconnect structure of claim 5, wherein each conducting tube has a diameter of about 5 nm to about 100 nm.

8. A semiconductor package structure comprising:
   a semiconductor device comprising at least one conducting pillar extending directly from the semiconductor device; and
   an interconnect structure comprising a plurality of unit cells, wherein each unit cell is formed of interconnected conducting segments, and wherein the plurality of unit cells forms a conducting lattice;
   wherein a first end of the interconnect structure is directly connected to the at least one conducting pillar, and a second end of the interconnect structure, opposite to the first end is directly connected to a portion of a lead frame; and wherein the at least one conducting pillar includes copper.

9. The structure of claim 8, wherein each of the interconnected conducting segments has a length of about 5 microns to about 400 microns extending from one side of the lattice to another side of the lattice.

10. The structure of claim 8, wherein the interconnected conducting segments form a flexible structure.

11. The structure of claim 8, wherein the interconnected conducting segments form a compressible structure.

12. The structure of claim 8, wherein each of the interconnected conducting segments is a conducting tube.

13. The structure of claim 12, wherein each conducting tube is hollow.

14. The structure of claim 12, wherein each conducting tube has a diameter of about 5 nm to about 100 nm.

15. A semiconductor package comprising:
   a semiconductor device;
   at least one bump directly extending from the semiconductor device;
   a plurality of unit cells forming a conducting lattice connected to the at least one bump; and a portion of a lead frame directly connected to the conducting lattice, wherein the conductive lattice is between the portion of the lead frame and the at least one bump.

16. The semiconductor package of claim 15, wherein the conductive lattice is between the portion of the lead frame and the at least one bump from a cross-sectional side view of the semiconductor package.

17. The semiconductor package of claim 15, wherein the at least one bump includes copper.

18. The structure of claim 8, wherein the interconnect structure does not include solder.

\* \* \* \* \*